Jan. 1, 1957 W. J. McGINLEY 2,776,415

TUBE SOCKET FOR PRINTED WIRING PANELS

Filed June 25, 1953

INVENTOR.
WILLIAM J. McGINLEY
BY Ralph B. Stewart
ATTORNEY

United States Patent Office 2,776,415
Patented Jan. 1, 1957

2,776,415

TUBE SOCKET FOR PRINTED WIRING PANELS

William J. McGinley, Park Ridge Manor, Ill., assignor to Methode Manufacturing Corporation, Chicago, Ill., a corporation of Illinois Application June 25, 1953, Serial No. 364,109

21 Claims. (Cl. 339—193)

This invention relates to a socket for a pronged electronic tube, and more particularly, the invention relates to a socket which is adapted for use with so-called printed wiring panels.

Printed wiring panels are now well known in the art, and may be formed in different ways. One common form consists of an insulating panel having a sheet of conducting metal, for example, copper, disposed on one or both surfaces thereof. A large portion of the copper sheet is removed, as by etching, to leave on the surface of the panel a predetermined pattern of copper segments which form circuit connectors to the various elements in the circuit, such as, condensers, resistors, tubes, and the like. The socket of my invention is useful on printed wiring panels generally, that is, without limitation to any particular method of forming the printed circuit connectors on the panel. Also, the socket is useful where the circuit connectors are formed entirely on either face of the panel or are formed partly on one face and partly on the other.

The separate circuit elements are usually connected to the printed conductors on the panel by inserting their leads into holes formed in the panel and metal connectors, and soldering the printed conductors to the leads.

In order to form a good electrical bond between the leads of the circuit elements and the printed conductors, the panel and leads can be treated with a suitable soldering flux and the whole dipped into a bath of molten solder. The molten solder adheres only to the metal, thus forming satisfactory electrical connections between the element leads and the printed connectors.

While this known soldering process has many advantages, there has heretofore been no inexpensive method of soldering the individual contacts of a tube socket to their respective connectors without exposing the pin-receiving contact portion of the socket to molten solder which would adhere to the pin-receiving contact and interfere with plug-in operations. Heretofore, the best known methods required the sockets to be placed on the printed circuit panel, or its terminals inserted into matching holes in the printed circuit panel, and the socket contact leads were individually bent to contact the printed connectors on the panel, and then the leads were individually hand-soldered to the connectors.

It is an object of the present invention to overcome the disadvantages of the prior methods of hand-soldering a tube socket to a printed wiring panel. This is accomplished by forming the socket member with the individual contact leads disposed thereon in such a manner that the socket can be snapped into a hole in the printed circuit panel and, without further attention, is ready for soldering by the dip-solderihg process. Similarly, if hand or spot soldering methods are to be employed, the socket terminals are in a firmly anchored position close to printed conductors, thus simplifying this type of soldering.

It is another object of my invention to form the individual contact leads along the outside surface of the socket member so as to provide spring clips which engage the edges of a hole in the printed circuit panel, thus serving to retain the socket member firmly in the panel during the soldering operation.

An additional object is to devise a tube socket for use in the dip-soldering process and in which the contact sockets for receiving the tube pins are sealed against entry of molten solder therein during the soldering operation.

It is still a further object of this invention to form a center fastener or shield having a ground strap or tube shield terminal which may be conveniently soldered to a printed circuit connector in the manner described above.

It is yet another object of this invention to provide the socket member with metallic jumper bars from the center shield to predetermined socket contacts which also can be soldered by the convenient dip-soldering method described above.

These and other objects will become more readily apparent from the following detailed description of the invention in conjunction with the accompanying drawing, in which.

Figure 1:
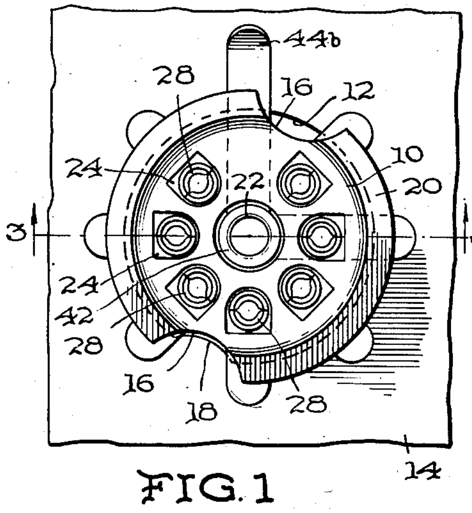
Figure 1 is a top plan view of a socket assembly located in a printed circuit panel.
Figure 2:
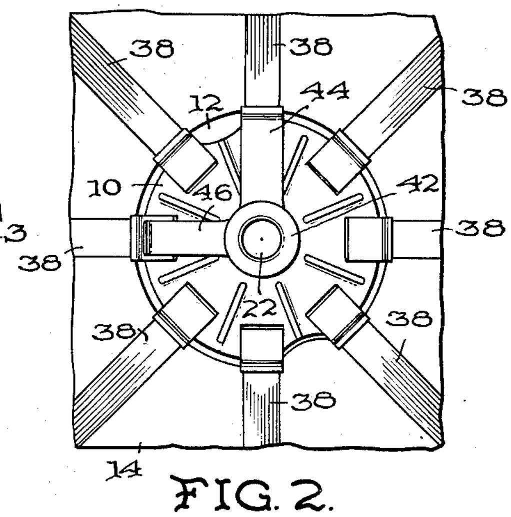
Figure 2 is a bottom view thereof.

Referring to the drawings, a socket body 10 is shown mounted in a hole 12 of a fragment of a printed circuit panel 14. The socket body 10 is generally circular in section and can have one or more locator grooves or keyways 16 in the surface thereof. These grooves mate with a key 18 formed by a projection in the hole 12 of the panel 14.

The socket body 10 is formed of any suitable insulating material and has molded integrally therewith an annular flange or shoulder 20 which serves as a stop to limit the movement of the socket member in a direction transverse to the plane of the panel 14.

Figure 5:
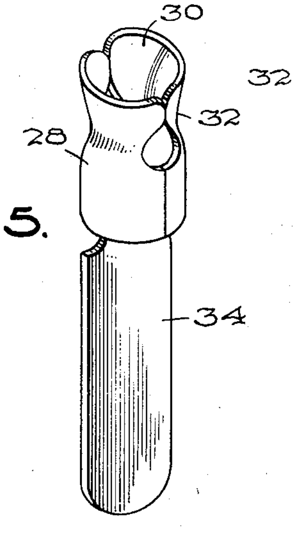
Figure 5 is a perspective view of a socket contact before it is assembled into the socket member.
Figure 6:
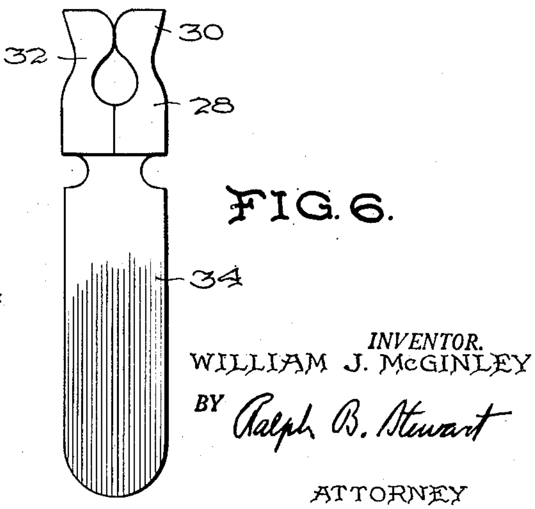
Figure 6 is an elevational view thereof.

The socket body 10 has an axial bore 22 and a number of prong-receiving bores 24 spaced radially out from the axial bore 22, and each containing a contact sleeve. The bores 24 are open at the top or prong-receiving end thereof and are closed at the bottom end except for a small slit 26 which opens in the lower end face of the body 10 and forms a restricted closed-wall extension of bore 24. It is not necessary that bores 24 be closed at the bottom to the extent shown in the drawing, so long as a shoulder is provided in the bore to form a seat for the contact sleeve and the clearance with the terminal is closed enough to prevent entry of solder when the assembly is dipped. Each bore 24 receives a metallic contact sleeve 28 which is adapted to receive and retain by frictional engagement a pin or prong from an electronic tube. The contact sleeve is best shown in Figures 5 and 6 and consists of a tubular configuration having a flared top portion 30 and a constricted portion 32 adapted to engage frictionally an electronic tube prong. Integral with the contact sleeve is a terminal strip or tail 34 which is to form the connection between the contact sleeve and one of printed circuit connectors 38 on the back face of panel 14.

Figure 3:
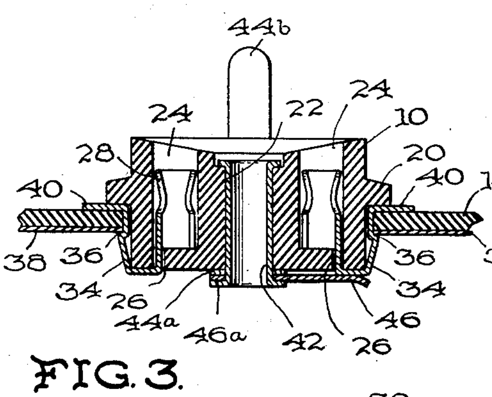
Figure 3 is a sectional view taken along lines 3—3 of Figure 1.
Figure 4:
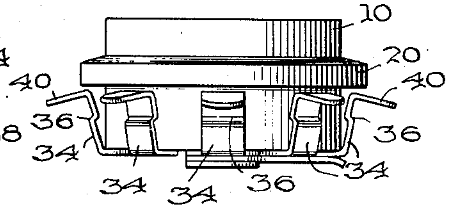
Figure 4 is an elevational view of a socket member.

The contact sleeve 28 is located in a bore 24 of the socket body 10 with the bottom end thereof seated on the bottom wall or shoulder of the bore. The terminal strip 34 preferably is of the same thickness throughout its length and comprises a first section extending downwardly through the slit 26 at the lower end of the bore 24 and a second section extending radially outwardly along the bottom of socket body 10, and a third section extending upwardly and outwardly toward the annular flange 20. It is preferred to have the terminal strips 34 substantially completely fill the slits 26 in order to prevent molten solder from entering the bores 24 and reaching the contact sleeves 28. The upwardly extending portion of each terminal strip 34 is provided with an inwardly extending off-set forming a shoulder 36 at a distance below annular flange 20 slightly greater than the thickness of the printed circuit panel with which the socket is to be used. The shoulder 36 serves two purposes, the first to act as a spring snap or clip to assist in retaining the socket in its position in the hole in the panel 14 and second, as shown in Figure 3, the shoulder 36 projects slightly over the edge of the hole 12 for a closer contact with its associated copper connector 38 printed on the panel 14. It will be noted that the terminal strips 34 emerge from the body 10 in a plane spaced rearwardly of the panel by a distance which provides appreciable flexibility to the unsupported third section of the strips extending upwardly from this plane and into the socket mounting hole.

As shown in the drawings, the strip 34 terminates in a fourth section comprising a radially outwardly extending end or tab portion 40 by which connection may be made to a printed circuit connector strip on the top face of the panel. This end portion 40 is not necessary where all printed circuit parts are on the bottom face of the panel. The annular flange 20 may be omitted where the strips 34 are provided with the radial portions 40. The tab portions 40 are located in a common plane normal to the axis of the body 10. The tabs 40 and the shoulders 36 at the ends of the spring sections of strips 34 constitute clips for engaging the upper and lower edges of the socket hole in panel 14.

Extending through the axial bore 22 is an eyelet 42 which may function as a center shield. The eyelet 42 fastens a ground strap 44 to the socket body, the strap having an eye portion 44*a* surrounding eyelet 42. The ground strap 44 can be formed of a flexible or pliable metal and is bent in the same configuration as the terminal strip 34 on contact sleeve 28. Thus, the ground strap will abut its associated printed connecting strip 38 on either face of the panel and will be soldered thereto when the unit is dipped into the solder bath.

Additionally, one or more jumper bars 46 are fastened by eyelet 42 to the socket body 10. One end of the jumper bar 46 is connected to ground strap 44 and the other end extends over the terminal strip 34 of one of the contact members 28 and in a position to be joined to the terminal strip by dip-soldering. The bars 46 may be formed integrally with the eye 44*a*, but it is preferred to form them separately and to provide each bar with an eye portion 46*a* which surrounds the eyelet 42. In this way the bar may be shifted to engage any one of strips 34, and two or more bars may be provided on one socket assembly.

An optional feature of the invention is to make the ground strap 44 considerably longer than the terminal strips 34 so as to form an extension 44*b* on the top side of the panel (Figure 3) which will serve as a tube shield terminal.

In operation, the printed circuit panel is formed with the connectors 38 abutting the edge of socket hole 12. As already explained, the printed circuit connectors may be carried on either or both faces of the panel. The socket is snapped into the socket hole 12 so that the shoulders 36 of terminal strip 34 abut the circuit strips 38. The electrical contacts to be soldered are then coated with a suitable soldering flux and the assembly is dipped in a solder bath. The solder will adhere to those metallic parts which have been coated with a flux and will thereby form soldered connections at the desired locations.

From the foregoing it will be seen that my invention involves a one-piece socket contact and terminal construction (sleeve 28 and terminal strip 34) which performs four functions as follows:

(1) Contacts both a tube pin and a printed circuit connector;

(2) Is self-retaining in the socket body;

(3) Prevents solder from entry into the tube pin contact proper; and (4) Provides a mechanical spring fastening for securing the socket assembly to the printed wiring panel.

It will be observed that the socket arrangement is particularly designed for convenient assembling operation in which the socket can be prepared for soldering to the printed circuit merely by snapping the socket into the appropriate hole in the printed circuit panel.

While I have disclosed what I deem to be a practical and efficient embodiment of my invention, I do not wish to be limited thereto since it is possible to make changes in the arrangement, disposition and form of the parts without departing from the principle of the invention as comprehended within the scope of the accompanying claims.

I claim:

1. An electron tube socket arranged to be located in a hole in a printed circuit panel comprising, an insulating body member adapted to be located in the hole of said panel, radially extending stop means extending outwardly from said body member, a plurality of parallel bores formed in said body member and opening through the top face thereof, each bore having a closed-wall restricted extension thereof opening through the surface of the body member at a point spaced below said stop means, and a pin-receiving contact disposed in each of said bores, each contact having a terminal strip extending downwardly through said closed-wall bore extension and upwardly along the outside of said body member, the upwardly extending portion of said strip along the outside of said body member being slightly bent away from said body member so as to form a spring engagement with the edge of the hole in said panel, said upwardly extending portion of said terminal strip having an inwardly extending off-set spaced from said stop means and providing a shoulder for engaging the lower face of said panel.

2. A socket arrangement according to claim 1, wherein each terminal strip is provided with an outwardly extending terminal portion spaced from said shoulder for engaging the top face of said panel.

3. In an electronic tube circuit, the combination of a printed circuit panel having at least one hole therethrough, conducting strips on a broad face of said printed circuit panel terminating at the edge of said hole, an insulating socket body member disposed in said hole and having a rear end portion extending beyond the rear face of said panel, said body member having a plurality of bores extending through said member in a direction transverse to the plane of said panel, each bore being arranged to receive a tube pin in one end thereof at the front end of said body member, a tube pin contact located in each bore, each tube pin contact having integral therewith a terminal strip extending out of its bore through the rear end surface of said body member, each terminal strip extending radially outward at the rear end of said socket member, and then back along the outside surface of said socket member and into said hole at a point adjacent the terminating of one of said conducting strips, and an electrical connection between each conducting strip and the adjacent terminal strip.

4. The combination according to claim 3, and including an annular flange formed integral with said insulating member, a shoulder formed in each terminal strip and spaced from said annular flange, said panel being clamped between said flange and the shoulders of said terminal strips.

5. The combination according to claim 3, and a tab portion on the end of each terminal strip extending radially outwardly from said hole and located between said annular flange and said panel.

6. An electron tube socket arrangement to be located in a hole in a printed circuit panel comprising, an insulating body member adapted to be located in the hole of said panel, a plurality of parallel bores formed in said body member and opening through the top face thereof, each bore having a closed-wall restricted extension thereof opening through the bottom end surface of said body, and a pin-receiving contact disposed in each of said bores, each contact having a terminal strip extending downwardly through said closed-wall bore extension and upwardly along the outside of said body member, the upwardly extending portion of said strip along the outside of said body member being slightly bent away from said body member so as to form a spring engagement with the edge of the hole in said panel, said upwardly extending portion of said terminal strip having an inwardly extending off-set providing a shoulder for engaging the lower face of said panel, and said body member being provided with a central bore parallel to said first-mentioned bores and extending through said body member, a conducting shield located within said central bore, and a ground strap connected to said conducting shield.

7. The socket arrangement according to claim 6, in which said ground strap extends along the side of said body member between said body member and the edge of the hole in said panel.

8. The socket arrangement according to claim 7, and at least one jumper strap connected at one end to said conducting shield and having the other end arranged adjacent to one terminal strip of a socket contact.

9. A socket arrangement to receive the pins of an electronic tube comprising, a body member formed of insulating material, means forming a central bore in said body member, an eyelet located in said central bore, a ground strap connected to said eyelet at the bottom of said member, means forming, in said body member, a plurality of bores parallel to said central bore, a plurality of socket contacts disposed in said bores, each having a terminal strip extending through its bore and out of the bottom of said body member, and a jumper bar attached to said eyelet and engaging one of said terminal strips for electrical contact therewith, said jumper bar being rotatably mounted on said eyelet whereby it can be rotated to engage any selected terminal strip.

10. In an electronic tube circuit, the combination of a printed circuit panel having at least one hole therethrough, conducting strips carried by one face of said panel and terminating at the edge of said hole, an insulating socket body member disposed in said hole and having end portions projecting beyond the two faces of said panel, said body member having a number of bores extending axially through the entire length thereof and each bore being arranged to receive a tube pin in one end thereof at the front end of said body member, a tube pin contact located in each bore and having integral therewith a terminal strip extending out of its bore at the rear end face of said body member, each terminal strip extending radially outwardly at the rear end of said socket member and then backwardly along the outside surface of said body member to the rear face of said panel and then into said hole, said terminal strips being located in said hole in positions to be soldered directly to said conducting strips carried by said panel.

11. A combination according to claim 10 and including means engaging the front face of said panel to limit the movement of said socket member through said hole, and wherein each of said terminal strips is provided with an outwardly projecting shoulder engaging the rear face of said panel.

12. A combination according to claim 10 wherein certain of said terminal strips extend through the socket hole in said panel, and conductor strips are carried by the top face of said panel and located in positions to be soldered directly to the terminal strips extending through said hole.

13. An electron tube socket for use with a printed circuit panel having a socket-mounting hole formed therein comprising, a substantially cylindrical body member formed of insulating material and having a plurality of bores formed therein on axes substantially parallel to the axis of said body member, said bores having openings at each end of said body member, a pin-receiving contact disposed in each of said bores and having a resilient terminal strip formed integrally therewith and being of uniform thickness throughout its length, each of said terminal strips comprising a first section extending downwardly from its pin-receiving contact through the bottom opening of its bore, a second section extending radially outward at the bottom end of said body member, and a third section extending upwardly along the outside of said body member, the upper end portions of said third sections being spaced outwardly from said body member to have resilient contact with the edge of said hole when said socket is inserted therein.

14. A socket according to claim 13 wherein said body member is provided with a central bore formed parallel with said first-mentioned bores, a conducting shield located within said central bore, and an electrical connection from said shield to at least one of said terminal strips at the bottom end of said body member.

15. A socket arrangement to receive the pins of an electronic tube comprising, a body member formed of insulating material, means forming a central bore in said body member, a conducting shield located in said central bore, a ground strap connected to said shield at the bottom of said body member, means forming, in said member, a plurality of bores parallel to said central bore, a plurality of pin-receiving contacts disposed in said bores, each contact having a terminal strip extending out of its bore at the bottom of said member then radially outward at the rear end of the body member and then along the outer wall thereof towards the top of the body member, and a jumper bar attached at one end to said shield and being rotatable about the axis of said central bore to engage a selected one of said terminal strips for electrical contact therewith.

16. In an electronic tube circuit, the combination of a printed circuit panel having at least one hole therethrough, conducting strips carried by one face of said panel and terminating at the edge of said hole, an insulating socket body member disposed in said hole and having end portions projecting beyond the two faces of said panel, the front end portion of said body member having a stop portion extending radially beyond the edge of said hole and preventing said body member from being passed through said hole, said body member having a number of bores extending axially therethrough and each bore being arranged to receive a tube pin in one end thereof at the front end of said body member, a tube pin contact located in each bore and having integral therewith a resilient terminal strip extending out of said bore at the rear end of said body member, said terminal strip being of uniform thickness throughout its length and comprising an integral extension of the material of said pin contact, each terminal strip extending radially outwardly at the rear end of said socket member and then along the outside surface of said socket member to the rear face of said panel and then into said hole, said terminal strips exerting resilient pressure against the lower edge of said hole and holding said stop portion in contact with said panel and said terminal strips being located in said hole in positions to be soldered directly to said conducting strips carried by said panel.

17. An electron-tube socket for use with a printed circuit panel having a socket-mounting hole formed therein comprising, a body member formed of insulating material and having a circular section of a size to pass through said hole, said circular section having a plurality of pin-receiving apertures formed therein parallel to the axis of said circular section and being spaced about said axis in a circle, a plurality of pin-receiving contacts carried by said body member, one for each pin-receiving aperture, each pin-receiving contact being formed of sheet-metal and having a resilient terminal strip integrally formed throughout its length of the sheet-metal of said pin-receiving contact and extending radially outward beyond the outer periphery of said circular section, each terminal strip having an unsupported section extending outwardly from said body member and being inclined to the axis of said circular section, the free ends of said unsupported terminal-strip sections being located on a circle about the axis of said body member of greater diameter than the diameter of said socket-mounting hole, whereby upon passing said circular section through said hole, said unsupported terminal-strip sections have resilient engagement with the edge of said hole, radially-extending tab portions carried by the ends of said unsupported terminal-strip sections for engaging the upper surface of said panel surrounding said hole, and said unsupported sections of said terminal strips having inwardly extending shoulder portions spaced from said tab portions for engaging the rear face of said panel.

18. In an electronic tube circuit, the combination of a printed circuit panel having at least one hole therethrough, conducting strips carried by one face of said panel and terminating at the edge of said hole, an insulating socket body member having a circular section of a size to pass through said hole, said circular section having a plurality of pin-receiving apertures formed therein parallel to the axis of said circular section and being spaced about said axis in a circle, a plurality of pin-receiving contacts carried by said body member, one for each pin-receiving aperture, each pin-receiving contact having a resilient terminal strip attached thereto and extending radially outward beyond the outer periphery of said circular section, each terminal strip having an unsupported section extending outwardly from said body member and being inclined to the axis of said circular section, the free ends of said unsupported terminal-strip sections extending into said socket-mounting hole and being provided with clip elements having portions engaging the front and back edges of the socket-mounting hole at locations adjacent the ends of said conducting strips, and a soldered bond between each conducting strip and the adjacent clip element.

19. A socket arrangement to receive the pins of an electronic tube comprising, a socket member formed of insulating material, means forming a central bore in said socket member, a conducting shield located in said central bore, a ground strap connected to said shield at the bottom of said socket member, means forming, in said member, a plurality of bores parallel to said central bore, a plurality of pin-receiving contacts disposed in said bores, each contact having a terminal strip extending out of its bore and providing a contact portion at the bottom of said member and a jumper bar attached at one end to said shield and being rotatable about the axis of said central bore to engage a selected one of said contact portions for electrical contact therewith.

20. In an electron tube circuit, the combination of a printed circuit panel having a socket-mounting hole formed therein, conducting strips carried by the front face of said panel and terminating adjacent the edge of said hole, a socket body member formed of insulating material and having a circular section of a size to pass through said hole, said circular section having a plurality of pin-receiving apertures formed therein parallel to the axis of said circular section and being spaced about axis in a circle, a plurality of pin-receiving contacts carried by said body member, one for each pin-receiving aperture, each pin-receiving contact being formed of sheet-metal and having a resilient terminal strip integrally formed throughout its length of the sheet-metal of said pin-receiving contact and extending radially outward beyond the outer periphery of said circular section in a plane spaced from the rear face of said panel, each terminal strip having an unsupported section extending back from said plane towards said panel and being inclined to the axis of said circular section, the free ends of said unsupported terminal-strip sections being located on a circle about the axis of said body member of greater diameter than the diameter of said socket-mounting hole, whereby upon passing said circular section through said hole, said unsupported terminal-strip sections have resilient engagement with the edge of said hole, radially extending tab portions carried by the ends of said unsupported terminal-strip sections and engaging the upper surface of said panel surrounding said hole at locations adjacent the ends of said conducting strips, and soldered connections between each conducting strip and the adjacent tab portion.

21. In a socket device for use with a part having contact prongs, a socket body of insulating material having top and bottom faces, said body having a center recess extending therethrough and a series of prong-receiving recesses disposed around said center recess, said prong-receiving recesses extending into said body from said top face thereof, a prong-receiving contact element seated in each of said recesses, each of said contact elements having a terminal portion extending beyond said bottom face of said body, a rivet-like shield member disposed in said center recess, said rivet member having a head portion adjacent said top face of said body, a conductor member disposed adjacent said bottom face of said body, said conductor member having a substantially flat apertured base portion, said rivet extending through said aperture of said base portion and having a head portion at its end away from said first-mentioned head portion electrically engaging said base portion adjacent said aperture thereof, a conductor strip extending radially from the peripheral edge of said base portion for electrical engagement with the terminal portion of one of said contact elements, and a grounding lug extending from said shield member.

References Cited in the file of this patent

UNITED STATES PATENTS

| | | |
|---|---|---|
| 591,490 | Palm | Oct. 12, 1897 |
| 2,024,607 | Sharp | Dec. 17, 1935 |
| 2,229,585 | Osenberg | Jan. 21, 1941 |
| 2,246,722 | Del Camp | June 24, 1941 |
| 2,259,739 | Del Camp | Oct. 21, 1941 |
| 2,294,880 | Alden | Sept. 8, 1942 |
| 2,376,625 | Schmitt | May 22, 1945 |
| 2,569,550 | Barton | Oct. 2, 1951 |
| 2,571,845 | Del Camp | Oct. 16, 1951 |
| 2,578,288 | Cook | Dec. 11, 1951 |
| 2,595,188 | Del Camp | Apr. 29, 1952 |
| 2,613,244 | Del Camp | Oct. 7, 1952 |
| 2,668,281 | Clayton | Feb. 2, 1954 |
| 2,742,627 | Lazzery | Apr. 17, 1956 |

FOREIGN PATENTS

| | | |
|---|---|---|
| 247,937 | Great Britain | Nov. 18, 1926 |
| 711,016 | Great Britain | June 23, 1954 |